(12) United States Patent
Xi et al.

(10) Patent No.: US 7,852,663 B2
(45) Date of Patent: Dec. 14, 2010

(54) NONVOLATILE PROGRAMMABLE LOGIC GATES AND ADDERS

(75) Inventors: Haiwen Xi, Prior Lake, MN (US); Yang Li, Shoreview, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 335 days.

(21) Appl. No.: 12/125,975

(22) Filed: May 23, 2008

(65) Prior Publication Data

US 2009/0290268 A1 Nov. 26, 2009

(51) Int. Cl.
G11C 11/00 (2006.01)
(52) U.S. Cl. ............... 365/158; 365/171; 365/173; 365/209; 365/66
(58) Field of Classification Search .......... 365/158, 365/171, 173, 209, 225.5, 66
See application file for complete search history.

(56) References Cited

U.S. PATENT DOCUMENTS

| | | | |
|---|---|---|---|
| 6,542,000 B1 | 4/2003 | Black | |
| 6,744,086 B2 | 6/2004 | Daughton | |
| 6,774,391 B1 | 8/2004 | Cowburn | |
| 6,781,871 B2 * | 8/2004 | Park et al. ............. | 365/158 |
| 6,914,807 B2 | 7/2005 | Nakamura | |
| 7,110,284 B2 | 9/2006 | Hayakawa | |
| 7,224,601 B2 | 5/2007 | Panchula | |
| 7,233,039 B2 | 6/2007 | Huai | |
| 7,285,836 B2 | 10/2007 | Ju | |
| 7,502,249 B1 | 3/2009 | Ding | |
| 7,539,047 B2 | 5/2009 | Katti | |
| 7,728,622 B2 * | 6/2010 | Chua-Eoan et al. ......... | 326/40 |
| 2005/0269612 A1 | 12/2005 | Torok | |
| 2006/0083047 A1 * | 4/2006 | Fujita et al. ............ | 365/145 |
| 2006/0171199 A1 | 8/2006 | Ju | |
| 2007/0047294 A1 | 3/2007 | Panchula | |
| 2007/0246787 A1 | 10/2007 | Wang | |
| 2008/0277703 A1 | 11/2008 | Iwayama | |
| 2009/0185410 A1 | 7/2009 | Huai | |
| 2009/0296454 A1 | 12/2009 | Honda | |
| 2009/0310213 A1 | 12/2009 | Hing | |

OTHER PUBLICATIONS

K. Miura et al., A Novel SPRAM (SPin-transfer-torque-RAM) with a Synthetic Ferrimagnetic Free Layer..., VLSI Symposium on VLSI Tech. Digest of Technical Papers (2007).

A. Ney et al., Programmable Computing with a Single Magnetoresistance Element, Nature 425, 485 (2003).

(Continued)

*Primary Examiner*—Tuan T Nguyen
*Assistant Examiner*—Toan Le
(74) *Attorney, Agent, or Firm*—Campbell Nelson Whipps LLC

(57) ABSTRACT

Spin torque magnetic logic device having at least one input element and an output element. Current is applied through the input element(s), and the resulting resistance or voltage across the output element is measured. The input element(s) include a free layer and the output element includes a free layer that is electrically connected to the free layer of the input element. The free layers of the input element and the output element may be electrically connected via magnetostatic coupling, or may be physically coupled. In some embodiments, the output element may have more than one free layer.

22 Claims, 5 Drawing Sheets

OTHER PUBLICATIONS

L. Berger, Emission of Spin Waves bya Magnetic Multilayer Traversed by a Current, Phys. Rev. B 54, 9353 (1996).

W.C. Black, Jr. et al., Programmable Logic Using Giant-Magnetroresistance and Spin-Dependent Tunneling Devices (invited), J. Appl. Phys. 87, 6674 (2000).

H. Meng et al., A Spintronics Full Adder for Magnetic CPU, IEEE Elec. Dev. Lett. 26, 360 (2005).

R.P. Cowburn et al., Room Temperature Magnetic Quantum Cellular Automata, Science 287, 1466 (2000).

U.S. Appl. No. 12/126,014, filed May 23, 2008, Inventor: Xiaohua Lou.

* cited by examiner

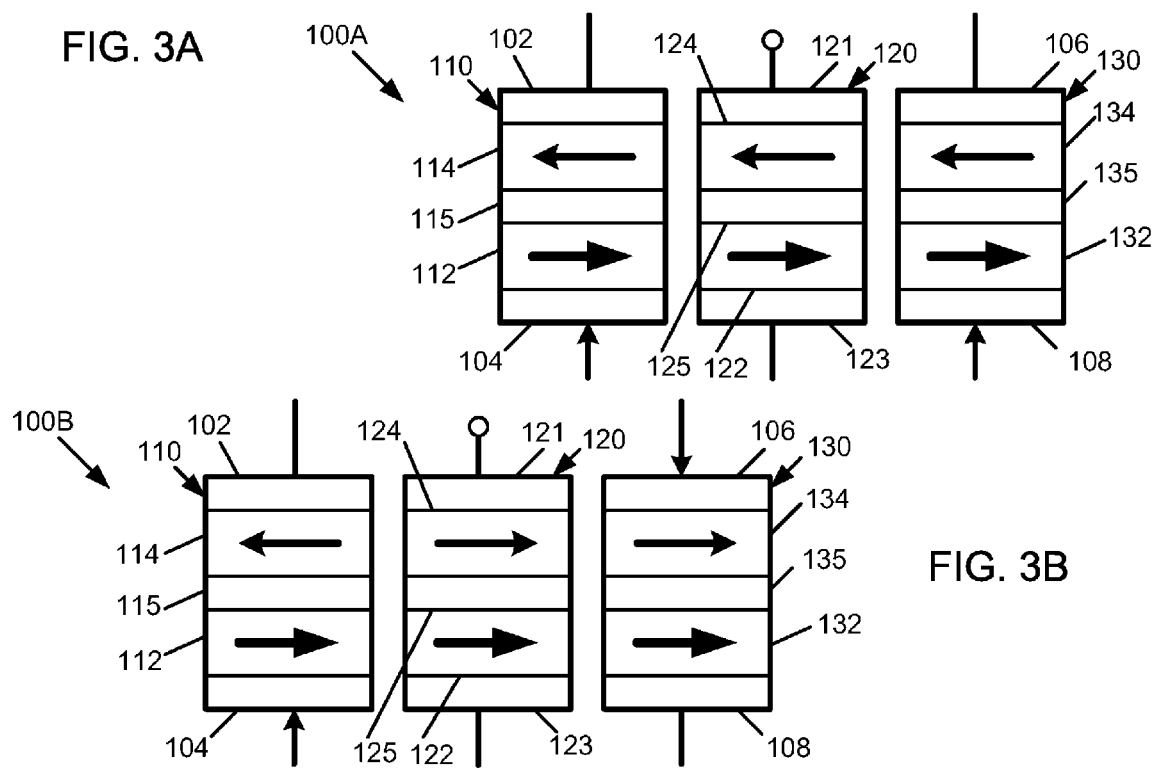
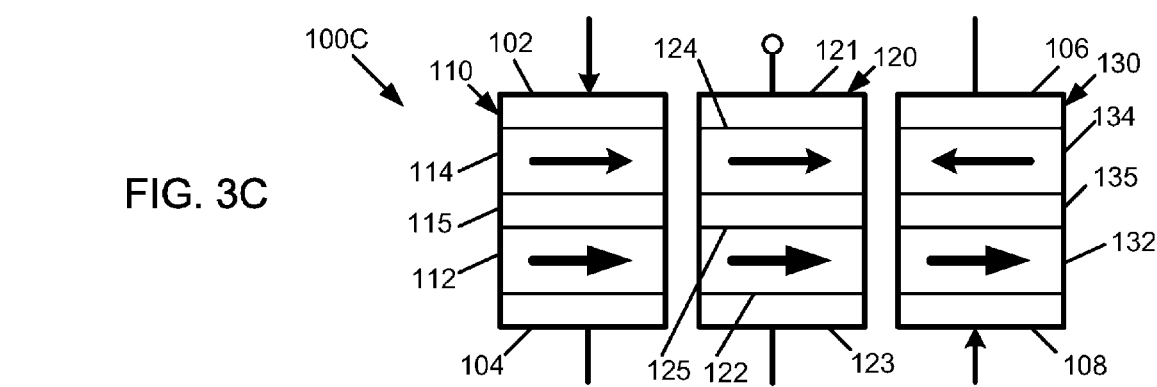

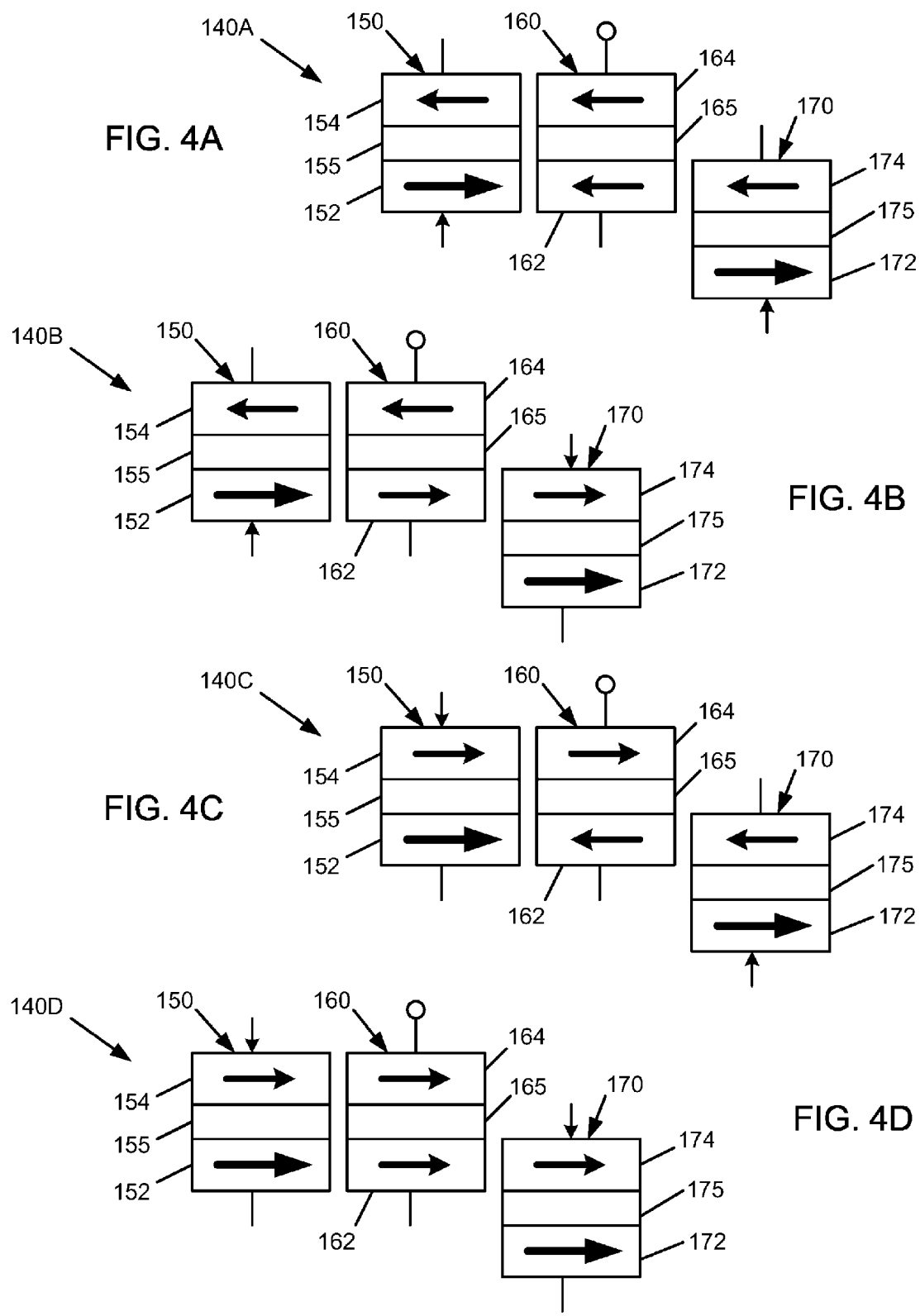

NONVOLATILE PROGRAMMABLE LOGIC GATES AND ADDERS

BACKGROUND

This application relates to spin torque transfer devices.

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. Such an element is generally referred to as a "spin tunneling junction," "magnetic tunnel junction" or the like. When the magnetization orientations of the free layer and pinned layer are parallel, the resistance of the element is low. When the magnetization orientations of the free layer and the pinned layer are antiparallel, the resistance of the element is high.

In order to sense the resistance of the magnetic element, current is driven through the magnetic element, either as current in plane ("CIP") or current perpendicular to the plane ("CPP"). In the CIP configuration, current is driven parallel to the layers of the spin valve. In the CPP configuration, current is driven perpendicular to the layers of magnetic element.

At least because of their small size, it is desirous to use magnetic logic elements in many applications. It has been proposed that these spin electronic devices could be used as logic devices. A magnetic field generated by even small currents could program a magnetic element component to several "logic states", i.e., higher resistance or lower resistance. Thus, it would be possible to sense or read the logic state by sending current through the programmed magnetic device and determining its resistance (i.e., whether it has high or low resistance). However, there are deficiencies in the proposed designs. Until this disclosure, complex logic functions can not be realized with magnetic logic devices employing magnetic fields. The present disclosure provides advanced programmable or reconfigurable magnetic devices that utilize an input magnetic element magnetostatically coupled to an output magnetic element.

BRIEF SUMMARY

The present disclosure relates to spin torque magnetic logic devices having at least two magnetic elements, at least one being an input element and one being an output element. Current is applied through the input element(s), and the resulting resistance across the output element is measured. Alternately, the resulting voltage across the output element is measured. The input element(s) include a free layer and the output element includes a free layer that is electrically connected to the free layer of the input element. The free layers of the input element and the output element may be electrically connected via magnetostatic coupling, or may be physically coupled. In some embodiments, the output element may have more than one free layer.

A first particular embodiment of this disclosure is to a magnetic logic device having a first magnetic element comprising a pinned layer, a free layer, and a barrier layer therebetween, the pinned layer and the free layer each having a magnetization orientation. The magnetic logic device also includes an output magnetic element positioned adjacent the first input magnetic element, the output magnetic element comprising at least one free layer, with the at least one free layer of the output magnetic element electrically coupled to the free layer of the input magnetic element. A current input into the input magnetic element provides a flow of electrons through the pinned layer and the free layer. An output sensing circuit electrically connected to the output magnetic element measures the voltage or resistance across the output element.

A second particular aspect of this disclosure is to a magnetic logic device having a first input magnetic element comprising a pinned layer, a free layer, and a barrier layer therebetween, and a second input magnetic element comprising a pinned layer, a free layer, and a barrier layer therebetween. The magnetic logic device also has an output magnetic element comprising at least one free layer, with the free layer of the output magnetic element coupled to the free layer of the first input magnetic element and to the free layer of the second input magnetic element via magnetostatic coupling. Also present is a first current input into the first input magnetic element, to provide a flow of electrons through the pinned layer and the free layer, and a second current input into the second input magnetic element, to provide a flow of electrons through the pinned layer and the free layer. An output sensing circuit is electrically connected to the output magnetic element to measure the voltage or resistance across the output element.

The free layer(s) of the output magnetic element can be electrically coupled to the free layer of the input magnetic element via magnetostatic coupling or by physical coextension.

Depending on the particular configuration of the input and out magnetic elements, the logic device may be an inverter, a follower, an AND gate, or an XOR gate.

These and various other features and advantages will be apparent from the following detailed description.

BRIEF DESCRIPTION OF THE DRAWINGS

The invention may be more completely understood in consideration of the following detailed description of various embodiments of the invention in connection with the accompanying drawings, in which:

FIGS. 3A through 3D are schematic diagrams of a third embodiment of a logic device according to the present disclosure, in particular, an AND gate.

FIGS. 4A through 4D are schematic diagrams of a fourth embodiment of a logic device according to the present disclosure, in particular, an XOR gate.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

All scientific and technical terms used herein have meanings commonly used in the art unless otherwise specified. The definitions provided herein are to facilitate understanding of certain terms used frequently herein and are not meant to limit the scope of the present disclosure.

Figures 1A, 1B:
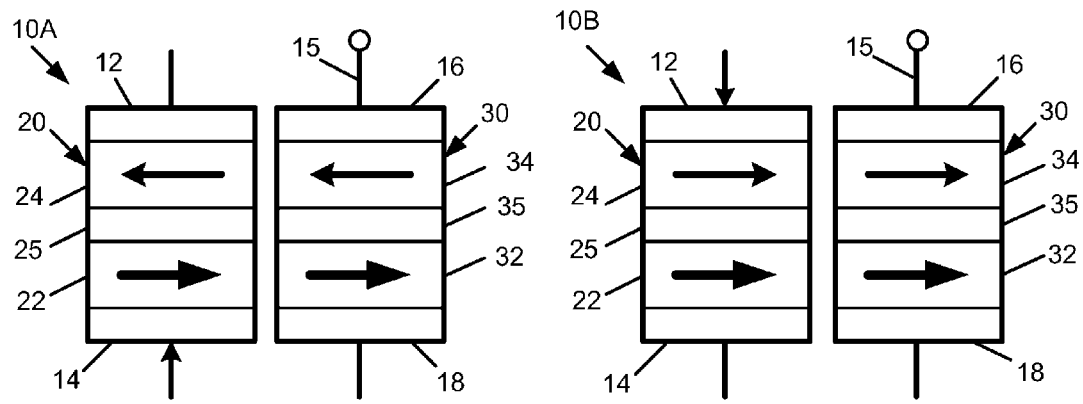
FIGS. 1A and 1B are schematic diagrams of a first embodiment of a logic device according to the present disclosure, in particular a magnetic digital inverter.

Referring to FIGS. 1A and 1B, an embodiment of a magnetic logic device 10A, 10B, respectively, is diagrammatically illustrated. Although not illustrated herein, logic device 10 is formed on a substrate. The difference between logic device 10A of FIG. 1A and logic device 10B of FIG. 1B will be described below. Logic device 10A, 10B includes a first magnetic element 20 and a second magnetic element 30 physically positioned adjacent to first magnetic element 20. Magnetic elements 20, 30 are positioned sufficiently close to allow magnetostatic coupling (i.e., magnetic dipolar interaction) between the elements. The coupling strength is inversely proportional to the separation of the elements. Thus, it is desirable to have element 20, 30 as close as possible, for example, about 100 nm.

First magnetic element 20 includes a ferromagnetic pinned layer 22, a ferromagnetic free layer 24, and a nonmagnetic barrier layer 25. Each of pinned layer 22 and free layer 24 has a magnetic orientation or magnetization orientation associated therewith. Pinned layer 22 may be pinned by an antiferromagnetic layer or may be a fixed layer without pinning but with a high coercivity to stabilize itself. Pinned layer 22 could be replaced by a synthetic antiferromagnetic (SAF) coupled structure, i.e., two ferromagnetic sublayers separated by a metallic spacer, such as Ru or Cu, with the magnetization orientations of the sublayers in opposite directions.

Barrier layer 25 may be a nonmagnetic metallic material or a nonmagnetic metal oxide material. Second magnetic element 30 includes a ferromagnetic pinned layer 32, a ferromagnetic free layer 34, and a nonmagnetic barrier layer 35. Each of pinned layer 32 and free layer 34 has a magnetic orientation or magnetization orientation associated therewith. Barrier layer 35 may be a nonmagnetic metallic material or a nonmagnetic metal oxide material.

First magnetic element 20 includes electrodes 12, 14 adjacent free layer 24 and pinned layer 22, respectively, and second magnetic element 30 includes electrodes 16, 18 adjacent free layer 34 and pinned layer 32, respectively. Although shown, the invention behind logic device 10A, 10B does not rely on electrodes 12, 14, 16, 18. Note that other layers, such as seed or capping layers, are not depicted for clarity.

Logic device 10A, 10B according to this disclosure includes an input element and an output element. In the embodiment of FIGS. 1A and 1B, first magnetic element 20 is an input element and second magnetic element 30 is an output element. In accordance with this disclosure, an electric current is applied through input element 20 and the result is a resistance or voltage level across adjacent output element 30. Logic device 10A, 10B includes a sensing circuit 15 electrically connected to output element 30 to measure the resistance or voltage or resistance level.

Since magnetic tunneling junction contributes the majority of the resistance or voltage across output element 30, the resistance and voltage of the element is determined, in large part, by the magnetization orientation of pinned layer 32 and free layer 34. Because pinned layer 32 has its magnetization orientation fixed, change in the magnetization orientation of free layer 34 will change the resistance and the logic bit state of output element 30. The resistance state of magnetic element 30 may be a low resistance state ($R_L$) or a high resistance state ($R_H$). Similarly, the voltage across magnetic element 30 may be a high voltage ($V_H$) or a low voltage ($V_L$). It is well established that when the magnetization orientations of the free layer and pinned layer are parallel, the resistance and voltage across the element is low, and that when the magnetization orientations of the free layer and the pinned layer are antiparallel, the resistance and voltage of the element is high.

FIGS. 1A and 1B illustrate the altering of the magnetization orientation of free layer 24 due to the input current applied to input device 20, and the altering of the magnetization orientation of free layer 34 of output device 30 due to its proximity to free layer 24. In both figures, the magnetization orientations of pinned layers 22, 32 are fixed having the same orientation.

In FIG. 1A, a current passes through input magnetic element 20 in the direction of pinned layer 22 to free layer 24. This direction of current orients the magnetization orientation of free layer 24 to be antiparallel to the orientation of pinned layer 22. Due to magnetostatic coupling, the adjacent free layer, free layer 34 of output magnetic element 30, orients itself to be parallel to free layer 24.

In FIG. 1B, a current passes through input magnetic element 20 in the direction of free layer 24 to pinned layer 22. This direction of current orients the magnetization orientation of free layer 24 to be parallel to the orientation of pinned layer 22. Due to magnetostatic coupling, the adjacent free layer, free layer 34 of output magnetic element 30, orients itself to be parallel to free layer 24.

In this embodiment, for this discussion, current flowing through element 20 in an upward direction (as in FIG. 1A) is defined as "0" and current flowing through element 20 in a downward direction (as in FIG. 1B) is defined as "1". On the output side, low resistance or low voltage across element 30 is defined as "0" and high resistance or high voltage is defined as "1". In FIG. 1A, inputted is "0" and the resulting output is "1"; in FIG. 1B, inputted is "1" and the resulting output is "0". This logic device is an inverter.

In some embodiments, it may be desired to use different definitions for the input current or for the output resistance or voltage. For example, if the definition of current flow is as defined above, but on the output side, low resistance or low voltage across element 30 is defined as "1" and high resistance or high voltage is defined as "0", then in FIG. 1A, inputted is "0" and the resulting output is "0", and in FIG. 1B, inputted is "1" and the resulting output is "1". As another example, opposite to the discussion above, if current flowing through element 20 in an upward direction (as in FIG. 1A) is defined as "1" and current flowing through element 20 in a downward direction (as in FIG. 1B) is defined as "0", and on the output side, low resistance or low voltage across element 30 is defined as "0" and high resistance or high voltage is defined as "1", then in FIG. 1A, inputted is "1" and the resulting output is "1", and in FIG. 1B, inputted is "0" and the resulting output is "0". Such a logic device is a follower (e.g., a magnetic digital follower).

Figure 2A:
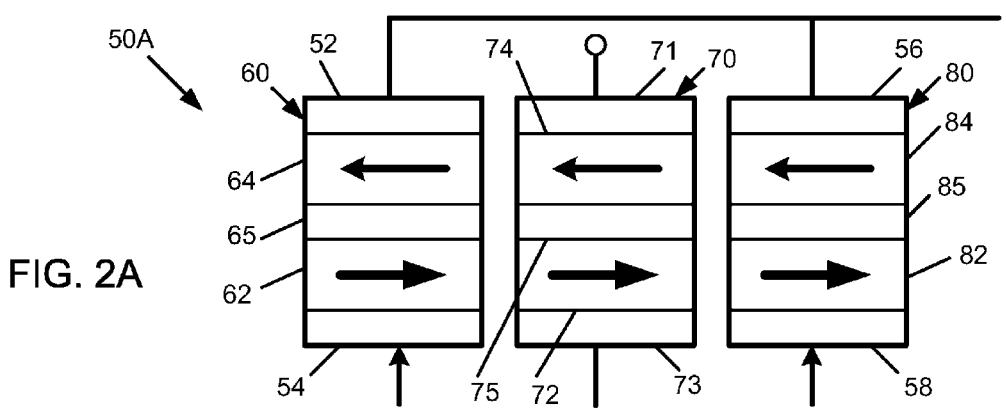
FIGS. 2A and 2B are schematic diagrams of a second embodiment of a logic device according to the present disclosure, in particular a magnetic digital inverter.
Figure 2B:
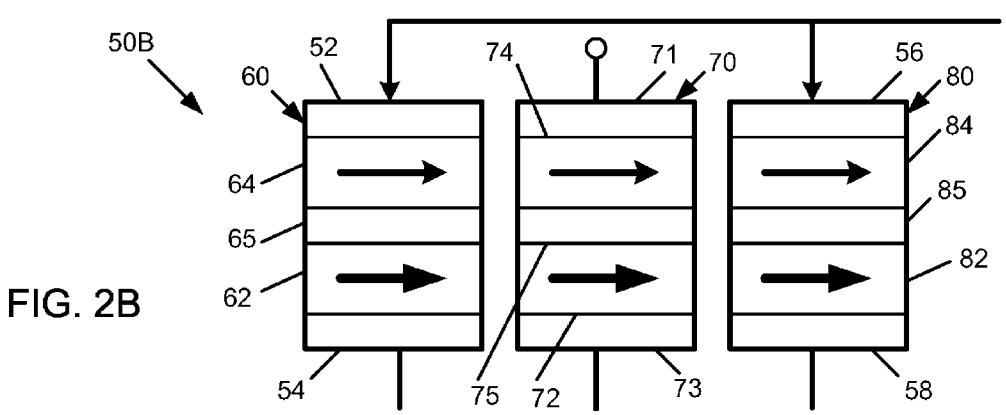

Another embodiment of a digital inverter is illustrated in FIGS. 2A and 2B. This embodiment utilizes two input magnetic elements, increasing the programmability of the logic device.

In FIGS. 2A and 2B, an embodiment of a magnetic logic device 50A, 50B, respectively, is diagrammatically illustrated. The difference between logic device 50A of FIG. 2A and logic device 50B of FIG. 2B will be described below. Logic device 50A, 50B includes a first magnetic element 60, a second magnetic element 70 physically positioned adjacent to first magnetic element 60, and a third magnetic element 80 physically positioned adjacent to second magnetic element 70, so that second magnetic element 70 is positioned between first and third magnetic elements 60, 80.

First magnetic element 60 includes a ferromagnetic pinned layer 62, a ferromagnetic free layer 64, and a nonmagnetic barrier layer 65. Second magnetic element 70 includes a ferromagnetic pinned layer 72, a ferromagnetic free layer 74, and a nonmagnetic barrier layer 75. Third magnetic element 80 also includes a ferromagnetic pinned layer 82, a ferromagnetic free layer 84, and a nonmagnetic barrier layer 85. Each of pinned layers 62, 72, 82 and free layers 64, 74, 84 has a magnetic orientation or magnetization orientation associated therewith.

Magnetic elements 60, 70, 80 include electrodes 52, 71, 56 adjacent free layers 64, 74, 84, respectively, and electrodes 54, 73, 58 adjacent pinned layers 62, 72, 82, respectively. Although shown, the invention behind logic device 50A, 50B does not rely on electrodes 52, 54, 71, 72, 56, 58. Note that other layers are not depicted for clarity.

Logic device 50A, 50B according to this disclosure includes two input elements and an output element. In the embodiment of FIGS. 2A and 2B, first magnetic element 60 is an input element, second magnetic element 70 is an output element, and third magnetic element 80 is a second input element. In accordance with this disclosure, an electric current is applied through input elements 60, 80 and the result is a resistance or voltage level across adjacent output element 70. Logic device 50A, 50B includes a sensing circuit electrically connected to output element 70 to measure the resistance or voltage level. In this embodiment, input elements 60, 80 are configured in parallel.

FIGS. 2A and 2B illustrate the defining of the magnetization orientation of free layer 64 due to the input current applied to input device 60 and the altering of the magnetization orientation of free layer 84 due to the input current applied to input device 80. The result is the magnetization orientation of free layer 74 of output device 70 due to its proximity to free layers 64, 84.

In FIG. 2A, a current passes through input magnetic elements 60, 80 in the direction of pinned layer 62, 82 to free layer 64, 84. This direction of current orients the magnetization orientation of free layers 64, 84 to be antiparallel to the orientation of pinned layers 62, 82. Due to magnetostatic coupling, the adjacent free layer, free layer 74 of output magnetic element 30, orients itself in the same orientation as free layers 64, 84.

In FIG. 2B, a current passes through input magnetic elements 60, 80 in the direction of free layer 64, 84 to pinned layer 62, 82. This direction of current orients the magnetization orientation of free layers 64, 84 to be parallel to the orientation of pinned layers 62, 82. Due to magnetostatic coupling, the adjacent free layer, free layer 74 of output magnetic element 70, orients itself to be in the same orientation as free layers 64, 84.

In this embodiment, for this discussion, current flowing through input elements 60, 80 in an upward direction (as in FIG. 2A) is defined as "0" and current flowing through elements 60, 80 in a downward direction (as in FIG. 2B) is defined as "1". On the output side, low resistance or low voltage across element 70 is defined as "0" and high resistance or high voltage is defined as "1". In FIG. 2A, inputted is "0" and the resulting output is "1"; in FIG. 2B, inputted is "1" and the resulting output is "0". This logic device is an inverter. In some embodiments, it may be desired to use different definitions for the input current or for the output resistance or voltage. Logic devices, such as followers, can be made in this manner.

Binary logic devices can also be made with magnetic elements, in accordance with this disclosure. An embodiment of an AND gate is schematically illustrated in FIGS. 3A through 3D, composed of two input magnetic elements and an output magnetic element.

In FIGS. 3A through 3D, an embodiment of a magnetic logic AND gate is diagrammatically illustrated. Logic device 100A, 100B, 100C, 100D includes a first magnetic element 110, a second magnetic element 120 physically positioned adjacent to first magnetic element 110, and a third magnetic element 130 physically positioned adjacent to second magnetic element 120, so that second magnetic element 120 is positioned between first and third magnetic elements 110, 140. Unlike the inverter of FIGS. 2A and 2B having two input magnetic elements and an output magnetic element, the two input magnetic elements are not electrically coupled.

First magnetic element 110 includes a ferromagnetic pinned layer 112, a ferromagnetic free layer 114, and a nonmagnetic barrier layer 115. Second magnetic element 120 includes a ferromagnetic pinned layer 122, a ferromagnetic free layer 124, and a nonmagnetic barrier layer 125. Third magnetic element 130 also includes a ferromagnetic pinned layer 132, a ferromagnetic free layer 134, and a nonmagnetic barrier layer 135. Each of pinned layers 112, 122, 132 and free layers 114, 124, 134 has a magnetic orientation or magnetization orientation associated therewith.

Magnetic elements 110, 120, 130 include electrodes 102, 121, 106 adjacent free layers 114, 124, 134, respectively, and electrodes 104, 123, 108 adjacent pinned layers 112, 122, 132, respectively. Although shown, the invention behind logic device 100A, 100B, 100C, 100D does not rely on electrodes 102, 104, 121, 123, 106, 108. Note that other layers are not depicted for clarity.

Logic device 100A, 100B, 100C, 100D according to this disclosure includes two input elements and an output element; first magnetic element 110 is an input element, second magnetic element 120 is an output element, and third magnetic element 130 is a second input element. In accordance with this disclosure, an electric current is independently applied through input elements 110, 130 and the result is a resistance or voltage level across adjacent output element 120.

FIGS. 3A through 3D illustrate the defining of the magnetization orientation of free layer 114 due to the input current applied to input device 110, the altering of free layer 134 due to the input current applied to input device 130, and the resulting magnetization orientation of free layer 124 of output device 120 due to its proximity to free layers 114, 134.

In FIG. 3A, a first current passes through input magnetic element 110 in the direction of pinned layer 112 to free layer 114. This direction of current orients the magnetization orientation of free layer 114 to be antiparallel to the orientation of pinned layer 112. A second, independent, current passes through input magnetic element 130 in the direction of pinned layer 132 to free layer 134. This direction of current orients the magnetization orientation of free layer 134 to be antiparallel to the orientation of pinned layer 132. In this embodiment, both free layers 114, 134 have the same directional magnetization orientation. Due to magnetostatic coupling, the adjacent free layer, free layer 124 of output magnetic element 120, orients itself to the same orientation as free layers 114, 134.

In FIG. 3B, a first current passes through input magnetic element 110 in the direction of pinned layer 112 to free layer 114 so that the resulting magnetization orientation of free layer 114 is antiparallel to the orientation of pinned layer 112. A second, independent, current passes through input magnetic element 130 in the direction of free layer 134 to pinned layer 132. This direction of current orients the magnetization orientation of free layer 134 to be parallel to the orientation of pinned layer 132. In this embodiment, the magnetization of free layer 134 is opposite to that of free layer 114. Free layer 124 of output element 120 has a default magnetization orientation of parallel to its pinned layer, layer 122.

FIG. 3C is similar, yet opposite, to FIG. 3B. A first current passes through input magnetic element 110 in the direction of free layer 114 to pinned layer 112 so that the resulting magnetization orientation of free layer 114 is parallel to the orientation of pinned layer 112. A second, independent, current passes through input magnetic element 130 in the direction of pinned layer 132 to free layer 134. This direction of current orients the magnetization orientation of free layer 134 to be antiparallel to the orientation of pinned layer 132. In this embodiment, the magnetization of free layer 134 is opposite to that of free layer 114. Free layer 124 of output element 120 has a default magnetization orientation of parallel to its pinned layer, layer 122.

FIG. 3D is similar, yet opposite, to FIG. 3A. A first current passes through input magnetic element 110 in the direction of free layer 114 to pinned layer 112 so that the resulting magnetization orientation of free layer 114 is parallel to the orientation of pinned layer 112. A second, independent, current passes through input magnetic element 130 in the direction of free layer 134 to pinned layer 132. This direction of current orients the magnetization orientation of free layer 134 to be parallel to the orientation of pinned layer 132. Due to magnetostatic coupling, free layer 124 of output magnetic element 120 orients itself in the same orientation as free layers 114, 134.

In this embodiment, for this discussion, current flowing through input elements 110, 130 in an upward direction (as in FIG. 3A) is defined as "1" and current flowing through elements 110, 130 in a downward direction (as in FIG. 3D) is defined as "0". On the output side, low resistance or low voltage across element 120, due to free layer 124 parallel with pinned layer 122, is defined as "0" and high resistance or high voltage is defined as "1". The input levels and output for the four configurations of FIGS. 3A through 3D is summarized below in Table 1.

TABLE 1

| FIG. | input 110 | input 130 | output 120 |
| --- | --- | --- | --- |
| FIG. 3A | 1 | 1 | 1 |
| FIG. 3B | 1 | 0 | 0 |
| FIG. 3C | 0 | 1 | 0 |
| FIG. 3D | 0 | 0 | 0 |

An embodiment of an XOR gate is schematically illustrated in FIGS. 4A through 4D, composed of two independent input magnetic elements and an output magnetic element. Unlike the previous embodiments discussed above, the output magnet element of this embodiment has two ferromagnetic free layers, rather than one free layer and one pinned layer.

In FIGS. 4A through 4D, logic device 140A, 140B, 140C, 140D includes a first magnetic element 150, a second magnetic element 160 physically positioned adjacent to first magnetic element 150, and a third magnetic element 170 physically positioned adjacent to second magnetic element 160, so that second magnetic element 160 is positioned between first and third magnetic elements 150, 170.

First magnetic element 150 includes a ferromagnetic pinned layer 152, a ferromagnetic free layer 154, and a nonmagnetic barrier layer 155. Second magnetic element 160 includes a first ferromagnetic free layer 162, a second ferromagnetic free layer 164, and a nonmagnetic barrier layer 165. Third magnetic element 170 also includes a ferromagnetic pinned layer 172, a ferromagnetic free layer 174, and a nonmagnetic barrier layer 175. Each of pinned layers 152, 172 and free layers 154, 162, 164, 172 has a magnetic orientation or magnetization orientation associated therewith. Not illustrated are various additional layers that might be present in elements 150, 160, 170 but that do not affect the function of logic device 140A, 140B, 140C, 140D.

Logic device 140A, 140B, 140C, 140D includes two input elements and an output element; first magnetic element 150 is an input element, second magnetic element 160 is an output element, and third magnetic element 170 is a second input element. An electric current is independently applied through input elements 150, 170 and the result is a resistance or voltage level across adjacent output element 160.

FIGS. 4A through 4D illustrate the defining of the magnetization orientation of free layer 154 due to the input current applied to input device 150, the defining of the magnetization orientation of free layer 174 due to the input current applied to input device 170, and the resulting magnetization orientation of free layer 162 of output device 160 due to its proximity to free layer 174, and the resulting magnetization orientation of free layer 164 due to its proximity to free layer 154. In this XOR gate, the magnetization orientations of two layers within output device 160 are defined by the two input elements.

In FIG. 4A, a first current passes through input magnetic element 150 to result in an antiparallel orientation of pinned layer 152 and free layer 154. Output element 160 is positioned with free layer 164 magnetostatically coupled to free layer 154 of input element 150. Thus, free layer 164 orients itself to the same orientation as free layer 154. A second, independent, current passes through input magnetic element 170 to result in an antiparallel orientation of pinned layer 172 and free layer 174. Input element 170 is positioned with free layer 174 magnetostatically coupled to free layer 162 of output element 160. Thus, free layer 162 orients itself to the same orientation as free layer 174.

In FIG. 4B, a first current passes through input magnetic element 150 to result in an antiparallel orientation of pinned layer 152 and free layer 154. Free layer 164 orients itself to the same orientation as free layer 154. A second, independent, current passes through input magnetic element 170 to result in a parallel orientation of pinned layer 172 and free layer 174. Free layer 162 orients itself to the same orientation as free layer 174.

Similarly in FIG. 4C, current passes through input magnetic element 150 to result in a parallel orientation of pinned layer 152 and free layer 154. Free layer 164 orients itself to the same orientation as free layer 154. A second, independent, current passes through input magnetic element 170 to result in an antiparallel orientation of pinned layer 172 and free layer 174. Free layer 162 orients itself to the same orientation as free layer 174.

And again in FIG. 4D, a first current passes through input magnetic element 150 to result in a parallel orientation of pinned layer 152 and free layer 154. Free layer 164 orients itself to the same orientation as free layer 154. A second, independent, current passes through input magnetic element 170 to result in a parallel orientation of pinned layer 172 and free layer 174. Free layer 162 orients itself to the same orientation as free layer 174.

In this embodiment, for this discussion, current flowing through input elements 150, 170 in an upward direction (as in FIG. 4A) is defined as "1" and current flowing through elements 150, 170 in a downward direction (as in FIG. 4D) is defined as "0". On the output side, low resistance or low voltage across element 160, due to free layer 164 parallel with free layer 162, is defined as "0" and high resistance or high voltage is defined as "1". The input levels and output for the four configurations of FIGS. 4A through 4D is summarized below in Table 2.

TABLE 2

| FIG. | input 150 | input 170 | output 160 |
|---|---|---|---|
| FIG. 4A | 1 | 1 | 0 |
| FIG. 4B | 1 | 0 | 1 |
| FIG. 4C | 0 | 1 | 1 |
| FIG. 4D | 0 | 0 | 0 |

Figure 5:
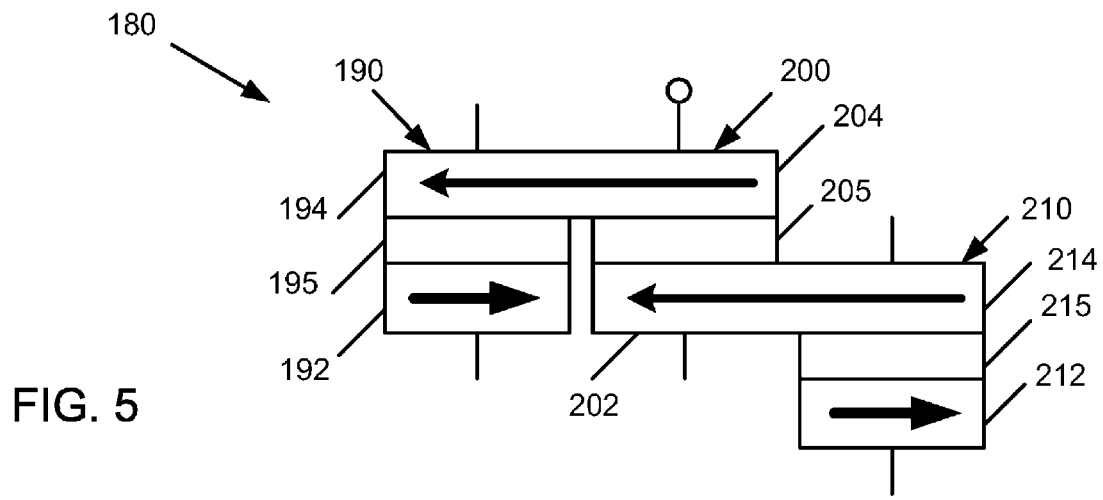
FIG. 5 is a schematic diagram of a fifth embodiment of a logic device according to the present disclosure, in particular, an XOR gate.
Figure 6:
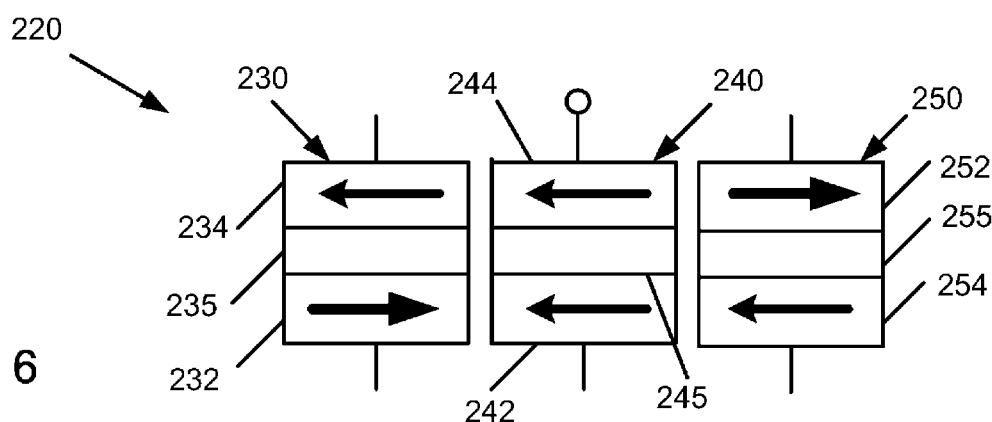
FIG. 6 is a schematic diagram of a sixth embodiment of a logic device according to the present disclosure, in particular, an XOR gate.
Figure 7:
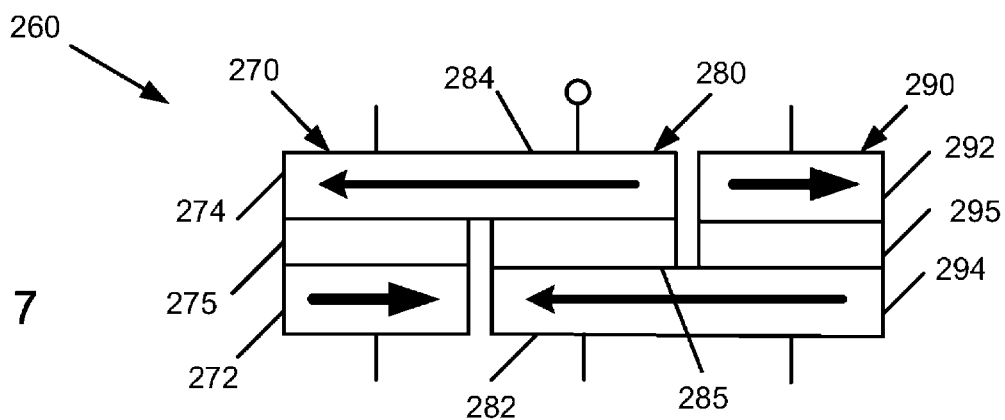
FIG. 7 is a schematic diagram of a seventh embodiment of a logic device according to the present disclosure, in particular, an XOR gate.

Alternative structures of XOR gates are illustrated in FIGS. 5 through 7. The various features of these logic device and magnetic elements are generally the same as described above for the other embodiments, unless specifically indicated otherwise. In the embodiments of FIGS. 5 and 7, the output elements have free layers that are shared with, and physically connected to the free layers of the input elements.

In FIG. 5, a logic device 180 is illustrated, having a first magnetic element 190 (an input element), a second magnetic element 200 (an output element) and a third magnetic element 210 (an input element). Similar to the XOR gate of FIGS. 4A through 4D, the output element (element 200) has two free layers, which have alterable magnetization orientations.

As illustrated in FIG. 5, input element 190 has a pinned layer 192, a free layer 194 and a barrier layer 195 therebetween. Input element 210 has a pinned layer 212, a free layer 214 and a barrier layer 215 therebetween. Output element 200 has a first free layer 202 and a second free layer 204, with a barrier layer 205 therebetween. First free layer 202 is coextensive with free layer 214 of output element 210; free layer 202 is physically connected to free layer 214. Similarly, second free layer 204 is coextensive with free layer 194 of output element 190; free layer 204 is physically connected to free layer 194. Pinned layer 212 of second input element 210 extends alone, that is, it is not planar or aligned with any layer of input element 190 or output element 200. Pinned layer 212 is positioned on the opposite side of coextensive free layer 202/214 as coextensive free layer 194/204. In the schematic FIG. 5, pinned layer 212 is positioned below the other layers.

For logic device 180, current applied to input elements 190, 210 will orient free layer 194, 214, and will directly orient connected free layers 204, 202, respectively.

Another alternate XOR gate is illustrated in FIG. 6 as logic device 220. Device 220 has a first magnetic element 230 (an input element) having a pinned layer 232, a free layer 234 and a barrier layer 235 therebetween, a second magnetic element 240 (an output element) having a first free layer 242 and a second free layer 244, with a barrier layer 245 therebetween, and a third magnetic element 250 (output element) having a pinned layer 252, a free layer 254 and a barrier layer 255 therebetween.

Unlike the previously described logic devices and magnetic elements, third magnetic element 250 is physically rotated in this embodiment. That is, pinned layer 252 is physically positioned over free layer 254, unlike in all the previous elements where the pinned layer was positioned below the free layer.

The general operation of logic device 220 is the same as others described above. Current applied to input element 230 will orient free layer 234 either parallel or antiparallel to pinned layer 232. Similarly, current applied to input element 250 will orient free layer 254 either parallel or antiparallel to pinned layer 252. Free layer 242 will orient itself to the same orientation as free layer 254, and free layer 242 will orient itself to the same orientation as free layer 234.

Logic device 260 of FIG. 7 is a combination of features from device 180 and device 220. Device 260 has a first magnetic element 270 (an input element) having a pinned layer 272, a free layer 274 and a barrier layer 275 therebetween, a second magnetic element 280 (an output element) having a first free layer 282 and a second free layer 284, with a barrier layer 285 therebetween, and a third magnetic element 290 (input element) having a pinned layer 292, a free layer 294 and a barrier layer 295 therebetween.

Similar to device 220 of FIG. 6, third magnetic element 290 is physically rotated with pinned layer 292 physically positioned over free layer 294. Similar to device 180 of FIG. 5, free layer 282 is physically connected to free layer 294, and free layer 284 is physically connected to free layer 274. Unlike device 180 of FIG. 5, however, pinned layer 292 is positioned on the same side of coextensive free layer 282/294 as coextensive free layer 274/284.

For logic device 260, current applied to input elements 270, 290 will orient free layer 274, 294, respectively, and will directly orient connected free layers 284, 282, respectively.

Figure 8:
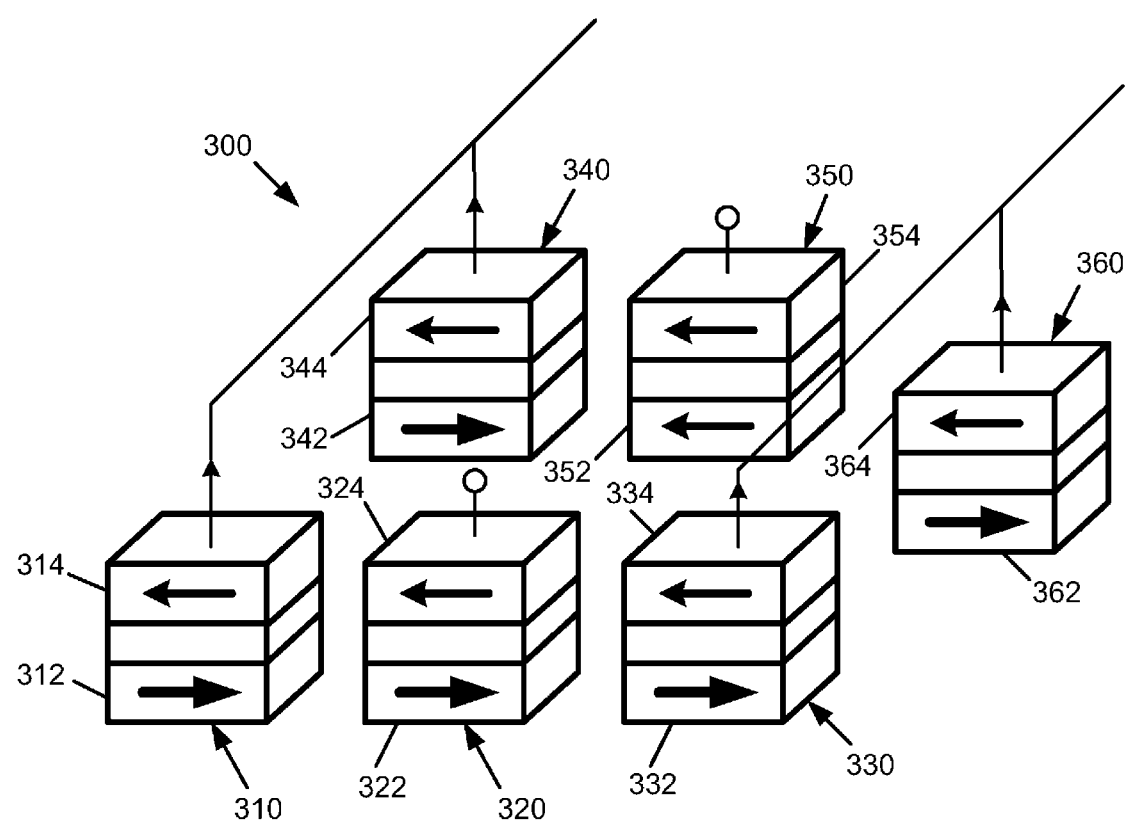
FIG. 8 is a schematic diagram of an eighth embodiment of a logic device according to the present disclosure, in particular, a half-adder composed of an AND gate and an XOR gate.

Another type of logic device is illustrated in FIG. 8. Logic device 300 is a half-adder, combining an AND gate and a XOR gate. In the illustrated embodiment, the input elements of the two gates are connected in parallel; in alternate embodiments, the input elements of the two gates could be connected in series. Also in the illustrated embodiment, the output of the AND gate is the "carryout", and the output of ht XOR gate is the "sum" of the output.

Referring to FIG. 8, logic device 300 is composed of six magnetic elements, 310, 320, 330, 340, 350 and 360.

Magnetic element 310, an input element, has a pinned layer 312, a free layer 314, and a barrier layer therebetween. Magnetic element 320, an output element, has a pinned layer 322, a free layer 324, and a barrier layer therebetween. Magnetic element 330, an input element, has a pinned layer 332, a free layer 334, and a barrier layer therebetween. Magnetic element 340, an input element, has a pinned layer 342, a free layer 344, and a barrier layer therebetween. Magnetic element 350, an output element, has a first free layer 352, a second free layer 354, and a barrier layer therebetween. Magnetic element 360, an input element, has a pinned layer 362, a free layer 364, and a barrier layer therebetween. Elements 310, 320, 330 form an AND gate; elements 340, 350, 360 form an XOR gate. Input elements 310 and 340 are electrically connected in parallel, and input element 330 and 360 are electrically connected in parallel; it is noted that not all electrical connections are illustrated in FIG. 8. Output element 320 is magnetostatically coupled to input elements 310 and 330, and output element 350 is magnetostatically coupled to input elements 340 and 360.

The input levels and output for the half-adder of FIG. 8 are summarized below in Table 3.

TABLE 3

| Input 310, 340 | Input 330, 360 | Output 320 (AND gate) | Output 350 (XOR gate) |
|---|---|---|---|
| 1 | 1 | 1 | 0 |
| 1 | 0 | 0 | 1 |
| 0 | 1 | 0 | 1 |
| 0 | 0 | 0 | 0 |

Various configurations for magnetic logic elements have been discussed above. Thus, numerous embodiments of the NON-VOLATILE PROGRAMMABLE LOGIC GATES AND ADDERS are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a system, apparatus or method. For example, if a device includes a first input magnetic element, it should not be implied that a second input magnetic element is required in that device.

What is claimed is:

1. A magnetic logic device comprising:
   a first input magnetic element comprising a pinned layer, a free layer, and a barrier layer therebetween, the pinned layer and the free layer each having a magnetization orientation;
   a current input into the first input magnetic element to provide a flow of electrons through the pinned layer and the free layer;
   an output magnetic element positioned adjacent the first input magnetic element, the output magnetic element comprising at least one free layer, with the at least one free layer of the output magnetic element electrically coupled to the free layer of the first input magnetic element; and
   an output sensing circuit electrically connected to the output magnetic element to measure voltage or resistance across the output element,
   wherein the at least one free layer of the output magnetic element is electrically coupled to the free layer of the first input magnetic element via magnetostatic coupling.

2. The logic device of claim 1, wherein the first input magnetic element and the second magnetic element are about 100 nm apart.

3. The logic device of claim 1, wherein the magnetic logic device is an inverter.

4. A magnetic logic device comprising:
   a first input magnetic element comprising a pinned layer, a free layer, and a barrier layer therebetween, the pinned layer and the free layer each having a magnetization orientation;
   a current input into the first input magnetic element to provide a flow of electrons through the pinned layer and the free layer;
   an output magnetic element positioned adjacent the first input magnetic element, the output magnetic element comprising at least one free layer, with the at least one free layer of the output magnetic element electrically coupled to the free layer of the first input magnetic element;
   an output sensing circuit electrically connected to the output magnetic element to measure voltage or resistance across the output element; and
   a second input magnetic element comprising a pinned layer, a free layer, and a barrier layer therebetween, and a current input into the second input magnetic element to provide a flow of electrons through the pinned layer and the free layer.

5. The logic device of claim 4, wherein the free layer of the second input magnetic element is proximate the free layer of the output magnetic element.

6. The logic device of claim 5 wherein the magnetic logic device is an AND gate.

7. The logic device of claim 5, wherein the second input magnetic element is electrically connected in parallel to the first input magnetic element.

8. The logic device of claim 7, wherein the magnetic logic device is an inverter.

9. The logic device of claim 5, wherein the output magnetic element comprises the at least one free layer and a second free layer, and wherein the at least one free layer is proximate the free layer of the first input magnetic element and the second free layer is proximate the free layer of the second input magnetic element.

10. The logic device of claim 9, wherein the magnetic logic device is an XOR gate.

11. The logic device of claim 9, wherein the at least one free layer of the output magnetic element is coextensive with the free layer of the input magnetic element, and the second free layer of the output magnetic element is coextensive with the free layer of the second input magnetic element.

12. A magnetic logic device comprising:
   a first input magnetic element comprising a pinned layer, a free layer, and a barrier layer therebetween, the pinned layer and the free layer each having a magnetization orientation;
   a first current input into the first input magnetic element to provide a flow of electrons through the pinned layer and the free layer;
   a second input magnetic element comprising a pinned layer, a free layer, and a barrier layer therebetween, the pinned layer and the free layer each having a magnetization orientation;
   a second current input into the second input magnetic element to provide a flow of electrons through the pinned layer and the free layer;
   an output magnetic element positioned adjacent the first input magnetic element and the second input magnetic element, the output magnetic element comprising a first free layer and a second free layer, the first free layer of the output element coextensive with the free layer of the first input magnetic element and the second free layer of the output element coextensive with the free layer of the second input magnetic element; and an output sensing circuit electrically connected to the output magnetic element to measure voltage or resistance across the output element.

13. The logic device of claim 12, wherein the coextensive free layer of the second input magnetic element and the output magnetic element is adjacent the pinned layer of the first input magnetic element.

14. The logic device of claim 13, wherein the pinned layer the second input magnetic element is not adjacent any layer of the output magnetic element or the first input magnetic element.

15. The logic device of claim 13, wherein the coextensive free layer of the first input magnetic element and the output magnetic element is adjacent the pinned layer of the second input magnetic element.

16. A magnetic logic device comprising:

a first input magnetic element comprising a pinned layer, a free layer, and a barrier layer therebetween;

a first current input into the first input magnetic element, to provide a flow of electrons through the pinned layer and the free layer;

a second input magnetic element comprising a pinned layer, a free layer, and a barrier layer therebetween;

a second current input into the second input magnetic element, to provide a flow of electrons through the pinned layer and the free layer; and an output magnetic element comprising at least one free layer, with the free layer of the output magnetic element coupled to the free layer of the first input magnetic element and to the free layer of the second input magnetic element via magnetostatic coupling;

an output sensing circuit electrically connected to the output magnetic element to measure voltage or resistance across the output element.

17. The magnetic logic device of claim 16, wherein the second free layer is proximate the free layer of the output magnetic element.

18. The magnetic logic device of claim 17, wherein the magnetic logic device is an AND gate.

19. The magnetic logic device of claim 17, wherein the second input magnetic element is connected in parallel to the first input magnetic element.

20. The magnetic logic device of claim 19, wherein the magnetic logic device is an inverter.

21. The magnetic logic device of claim 17, wherein the output element comprises a second free layer, and where the at least one free layer of the output magnetic element is coextensive with the free layer of the first input magnetic element, and the second free layer of the output magnetic element is coextensive with the second free layer of the second input magnetic element.

22. The magnetic logic device of claim 21, wherein the magnetic logic device is an XOR gate.

* * * * *